US011888333B2

(12) United States Patent
Baarman et al.

(10) Patent No.: US 11,888,333 B2
(45) Date of Patent: *Jan. 30, 2024

(54) BATTERY MONITOR SYSTEM AND METHOD

(71) Applicant: Global Battery Solutions LLC, Holland, MI (US)

(72) Inventors: David W Baarman, Fennville, MI (US); Henry W. Sybesma, Holland, MI (US); Jennifer S. Sierra, Holland, MI (US); Cathy L. Wiler, Zeeland, MI (US); Ellington L. Ellis, Byron Center, MI (US); Kristine A. Hunter, West Olive, MI (US); Lynne A. Sybesma, Holland, MI (US)

(73) Assignee: Global Battery Solutions LLC, Holland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/945,340

(22) Filed: Sep. 15, 2022

(65) Prior Publication Data

US 2023/0019408 A1 Jan. 19, 2023

Related U.S. Application Data

(63) Continuation of application No. 17/843,131, filed on Jun. 17, 2022, now Pat. No. 11,605,956, which is a
(Continued)

(51) Int. Cl.
*H01M 10/42* (2006.01)
*H02J 7/00* (2006.01)
(Continued)

(52) U.S. Cl.
CPC ........ *H02J 7/00036* (2020.01); *G01R 31/371* (2019.01); *G01R 31/382* (2019.01);
(Continued)

(58) Field of Classification Search
CPC ...... H02J 7/00036; H02J 7/00032; H02J 7/00; H02J 7/045; H02J 7/00045; H02J 7/00047;
(Continued)

(56) References Cited

U.S. PATENT DOCUMENTS 6,184,656 B1 2/2001 Karunasiri et al.
10,017,070 B2 * 7/2018 Brochhaus ............ B60R 16/023
(Continued)

FOREIGN PATENT DOCUMENTS

EP 2 642 574 9/2013
EP 2 985 854 2/2016
(Continued)

*Primary Examiner* — Khoi V Le

(74) *Attorney, Agent, or Firm* — Warner Norcross + Judd LLP

(57) ABSTRACT

A remote controlled battery cell monitoring and control system that utilizes empirical and theoretical data to compare performance, sensor data, stored patterns, historical usage, use intensity indexes over time and tracking information to provide a sophisticated data collection system for batteries. This tracking is designed to better the specifications, designs, training, preventative maintenance, and replacement and recycling of batteries.

19 Claims, 14 Drawing Sheets

Related U.S. Application Data continuation of application No. 16/636,582, filed as application No. PCT/US2018/045345 on Aug. 6, 2018, now Pat. No. 11,368,033.

(60) Provisional application No. 62/541,291, filed on Aug. 4, 2017.

(51) Int. Cl.
    *G01R 31/382* (2019.01)
    *G01R 31/371* (2019.01)
    *H04B 5/00* (2006.01)
    *H02J 50/20* (2016.01)

(52) U.S. Cl.
    CPC .............. *H02J 7/005* (2020.01); *H02J 7/007* (2013.01); *H02J 7/00032* (2020.01); *H02J 7/00045* (2020.01); *H02J 7/00047* (2020.01); *H02J 7/0047* (2013.01); *H02J 7/00712* (2020.01); *H02J 50/20* (2016.02); *H04B 5/0031* (2013.01); *H01M 10/4257* (2013.01); *H02J 7/0048* (2020.01)

(58) Field of Classification Search
    CPC .. H02J 7/0047; H02J 7/005; H02J 7/07; H02J 7/00712; H02J 7/0048; H02J 7/0069; H02J 50/20; G01R 31/371; G01R 31/382; H04B 5/0031; H04B 5/0037; H01M 10/4257; Y02E 60/10

See application file for complete search history.

(56) References Cited

U.S. PATENT DOCUMENTS

| | | | |
|---|---|---|---|
| 2004/0004464 | A1 | 1/2004 | Tsukamoto |
| 2006/0222912 | A1 | 10/2006 | Smith |
| 2010/0060434 | A1* | 3/2010 | Shiotsu ............... G06K 19/0717 340/10.51 |
| 2010/0256481 | A1 | 10/2010 | Mareci |
| 2011/0184575 | A1* | 7/2011 | Kawamoto ........... H04L 67/125 714/49 |
| 2011/0260687 | A1 | 10/2011 | Kudo et al. |
| 2011/0285347 | A1 | 11/2011 | Chen |
| 2013/0135084 | A1 | 5/2013 | Chakravarty |
| 2014/0225620 | A1 | 8/2014 | Campbell et al. |
| 2014/0266779 | A1 | 9/2014 | Grothaus et al. |
| 2015/0015192 | A1 | 1/2015 | Leabman et al. |
| 2015/0130979 | A1 | 5/2015 | Huang et al. |
| 2016/0133063 | A1* | 5/2016 | Lim ...................... G07C 5/0825 701/32.8 |
| 2017/0144562 | A1 | 5/2017 | Thomas et al. |
| 2018/0026255 | A1* | 1/2018 | Hellenthal ............ H01M 10/48 429/50 |

FOREIGN PATENT DOCUMENTS

| | | |
|---|---|---|
| EP | 3 196 808 | 7/2017 |
| JP | 2011-036106 | 2/2011 |
| JP | 2012-124141 | 6/2012 |
| JP | 2017-034686 | 2/2017 |
| KR | 10-2010-0017735 | 2/2010 |
| KR | 10-2011-0034147 | 4/2011 |
| KR | 10-2014-0082960 | 7/2014 |
| KR | 10-2015-0054632 | 5/2015 |
| KR | 10-2015-0132353 | 11/2015 |
| KR | 10-2017-0028644 | 3/2017 |
| WO | 2013/055479 | 4/2013 |
| WO | 2014/167889 | 2/2017 |
| WO | 2017/036935 | 3/2017 |

\* cited by examiner

| CHARGE RATE | TEMPERATURE F | | | | | |
|---|---|---|---|---|---|---|
| | <-10 | -10 - 20 | -20 - 70F | -70 - 120 | -120 - 160 | >160 |
| 1C | | | | | | |
| 1C TO 5C | | | | | | |
| 5C TO 10C | | | | | | |
| >10C | | | | | | |

| CHARGE RATE | TEMPERATURE F | | | | | |
|---|---|---|---|---|---|---|
| | <-10 | -10 - 20 | -20 - 70F | -70 - 120 | -120 - 160 | >160 |
| 1C | | | | | | |
| 1C TO 5C | | | | | | |
| 5C TO 10C | | | | | | |
| >10C | | | | | | |
| OFF TIME | | | | | | |
| EVENT TRANSITIONS | | | | | | |
| TRANSITION TIMES | | | | | | |
| SHOCK | | | | | | |
| CHARGED INTERNAL RESISTANCE | | | | | | |
| STARTING INTERNAL RESISTANCE | | | | | | |
| CHARGED VOLTAGE | | | | | | |
| STARTING VOLTAGE | | | | | | |

| COULOMBS | TEMPERATURE F | | | | | |
|---|---|---|---|---|---|---|
| | <-10 | -10 - 20 | -20 - 70F | -70 - 120 | -120 - 160 | >160 |
| RANGE AVAILABILITY 1 | | | | | | |
| RANGE AVAILABILITY 2 | | | | | | |
| RANGE AVAILABILITY 3 | | | | | | |
| RANGE AVAILABILITY 4 | | | | | | |

BATTERY HEALTH SCORING FORMULA

| EVENT | HEALTH REF. | BATTERY HEALTH SCORE (A,B,C,D) | % OF OPTIMAL | DIFF FROM AVG. | WEIGHTING OF IMPACT | USER MEASURED DATA ||| INTERNAL RESISTANCE POPULATION DISTRIBUTIONS ||| TEMPERATURE POPULATION DISTRIBUTIONS ||| VOLTAGE & CURRENT POPULATION DISTRIBUTIONS ||| CHARGE DISCHARGE XC POPULATION DISTRIBUTIONS |||
|---|---|---|---|---|---|---|---|---|---|---|---|---|---|---|---|---|---|---|---|---|
| | | | | | | ACTIVITY | AGE | USE | TAILS | AVERAGE | TIPS | TAILS | AVERAGE | TIPS | TAILS | AVERAGE | TIPS | TAILS | AVERAGE | TIPS |
| Pattern 1 | 96 | 66 | 68.75% | 86.36% | 3 | 6 | 7 | 9 | 2 | 6 | 9 | 2 | 4 | 11 | 4 | 9 | 12 | 4 | 9 | 12 |
| Pattern 2 | 117 | 75 | 64.10% | 92.00% | 3 | 7 | 8 | 10 | 3 | 5 | 10 | 4 | 8 | 15 | 6 | 10 | 14 | 6 | 10 | 14 |
| Pattern 3 | 164 | 100 | 60.98% | 98.00% | 4 | 7 | 8 | 10 | 5 | 7 | 12 | 4 | 8 | 14 | 6 | 9 | 15 | 6 | 9 | 15 |
| Pattern 4 | 235 | 160 | 68.09% | 93.75% | 5 | 8 | 12 | 12 | 4 | 8 | 12 | 6 | 11 | 19 | 7 | 11 | 16 | 7 | 11 | 16 |
| Pattern 5 | 282 | 192 | 68.09% | 93.75% | 6 | 8 | 12 | 12 | 5 | 8 | 12 | 7 | 12 | 18 | 6 | 10 | 17 | 6 | 10 | 17 |
| Pattern 6 | 350 | 267 | 82.00% | 78.05% | 7 | 10 | 20 | 11 | 6 | 10 | 16 | 8 | 13 | 20 | 5 | 9 | 18 | 5 | 9 | 14 |
| Shock | 84 | 56 | 66.67% | 92.86% | 2 | 11 | 6 | 8 | 4 | 14 | 10 | 2 | 5 | 12 | 3 | 7 | 12 | 3 | 7 | 12 |
| Temp Charge | 84 | 56 | 66.67% | 92.86% | 2 | 11 | 5 | 8 | 4 | 14 | 19 | 2 | 5 | 11 | 2 | 7 | 12 | 2 | 7 | 12 |
| Temp Discharge | 43 | 28 | 65.12% | 89.29% | 1 | 12 | 8 | 8 | 5 | 12 | 14 | 3 | 6 | 17 | 2 | 7 | 12 | 2 | 7 | 12 |
| Coulomb Charge | 45 | 26 | 57.78% | 100.00% | 1 | 10 | 7 | 9 | 3 | 10 | 17 | 4 | 7 | 13 | 4 | 9 | 15 | 4 | 9 | 15 |
| Coulomb Discharge | 156 | 80 | 51.28% | 85.00% | 4 | 10 | 5 | 5 | 3 | 10 | 16 | 1 | 4 | 10 | 1 | 5 | 13 | 1 | 5 | 13 |
| Temp storage | 68 | 42 | 61.76% | 80.95% | 2 | 7 | 8 | 6 | 2 | 7 | 12 | 3 | 4 | 12 | 2 | 6 | 10 | 2 | 6 | 10 |
| Cycles | 70 | 42 | 60.00% | 95.24% | 2 | 6 | 9 | 6 | 2 | 6 | 11 | 3 | 9 | 14 | 3 | 5 | 10 | 3 | 5 | 10 |
| Cycles Depth | 70 | 42 | 60.00% | 95.24% | 2 | 6 | 9 | 6 | 2 | 6 | 11 | 3 | 9 | 14 | 3 | 5 | 10 | 3 | 5 | 10 |
| Internal Resistance Temp | 70 | 42 | 60.00% | 95.24% | 2 | 6 | 9 | 6 | 2 | 6 | 11 | 3 | 9 | 14 | 3 | 5 | 10 | 3 | 5 | 10 |
| Charge voltage | 70 | 42 | 60.00% | 95.24% | 2 | 6 | 9 | 6 | 2 | 6 | 11 | 3 | 9 | 14 | 3 | 5 | 10 | 3 | 5 | 10 |
| Transitions | 70 | 42 | 60.00% | 95.24% | 2 | 6 | 9 | 6 | 2 | 6 | 11 | 3 | 3 | 14 | 3 | 5 | 10 | 3 | 5 | 10 |
| Overall Change | 90 | 51 | 56.67% | 82.35% | 3 | 6 | 6 | 5 | 2 | 6 | 11 | 2 | 3 | 11 | 1 | 5 | 8 | 1 | 5 | 8 |

Fig. 11

Battery Health Care Experience Scoring

| 5/10/17 | TODAY | TYPICAL | RATIOS |
|---|---|---|---|
| Maintenance | EX336F 2HJ98334512 | EX336F | |
| Charging | 5/5/14 | 26424 | 0.1% |
| Discharging | 27 | 32 | 84.4% |
| Temperature | 6 | 11 | 54.5% |
| Life Score | 90% | 120% | 75.0% |
| Service Interactions | 24 | 32 | 75.0% |
| Interactions | 210 | 170 | 123.5% |
| Operators | 14 | 2 | 700.0% |
| Charge Interval | 32 | 67 | 47.8% |
| Deep cycles | 6 | 8 | 75.0% |
| Short Cycles | 2 | 1 | 200.0% |
| Reader ID | MK341200984 | | |
| Inspectors | 1 | 1 | 100.0% |
| User ID | MK341200076 | | |

Consumables Score    47.8%
Service Score        97.9%
Hours Score          84.4%

Technician Score     80.3%
User Score           84.4%

Fig. 12

ID Protocol and registers

| PRIMARY REGISTERS | DATA | SECONDARY | DATA |
|---|---|---|---|
| Password | 8 Bytes | Password | 8 Bytes |
| S/N | 16 Bytes | S/N | 16 Bytes |
| Mfg Date | 12 Bytes | Mfg Date | 12 Bytes |
| Mfg ref voltage | 4 Bytes | Mfg ref voltage | 4 Bytes |
| Mfg Coulombs | 5 Bytes | Mfg Coulombs | 5 Bytes |
| Hours | 12 Bytes | Hours | 12 Bytes |
| Date/Time Installed | 12 Bytes | Date/Time Installed | 12 Bytes |
| Last Read | 4 Bytes | Last Read | 4 Bytes |
| Last Diagnostics | 4 Bytes | Last Diagnostics | 4 Bytes |
| Last Sort | 4 Bytes | Last Sort | 4 Bytes |
| Trigger Temp | 4 Bytes | Trigger Temp | 4 Bytes |
| Trigger Reststance | 4 Bytes | Trigger Reststance | 4 Bytes |
| Expected EOL Hours | 16 Bytes | Expected EOL Hours | 16 Bytes |
| Expected Internal resistance change | 16 Bytes | Expected Internal resistance change | 16 Bytes |
| Expected Coulomb Change Ref | 16 Bytes | Expected Coulomb Change Ref | 16 Bytes |
| Expected charge Time Ref | 16 Bytes | Expected charge Time Ref | 16 Bytes |
| Expected EOL Cycles | 16 Bytes | Expected EOL Cycles | 16 Bytes |

Fig. 13

| COMMAND | DESCRIPTION | VARIABLE A | VARIABLE B |
|---|---|---|---|
| 0x01 | Read data | Address | Length |
| 0x02 | Write Data | Address | Length |
| 0x03 | Monitor mode | Interval | duration |
| 0x04 | Balance mode | Interval | duration |
| 0x05 | Self discharge test mode | Interval | duration |
| 0x06 | Off mode | Interval | duration |
| 0x07 | Cell Battery Management mode | Interval | duration |
| 0x08 | Safety Mode | Interval | duration |
| 0x09 | Secure mode | Passcode | duration |

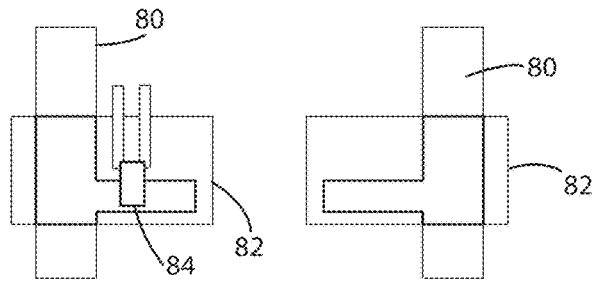
Fig. 21
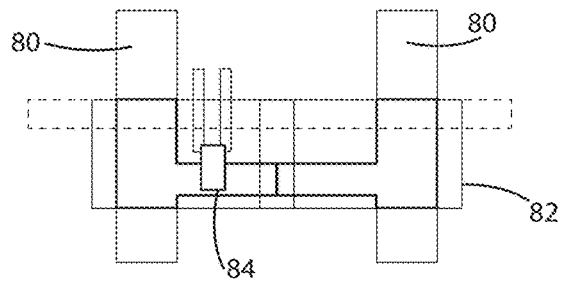
Fig. 22
Fig. 23
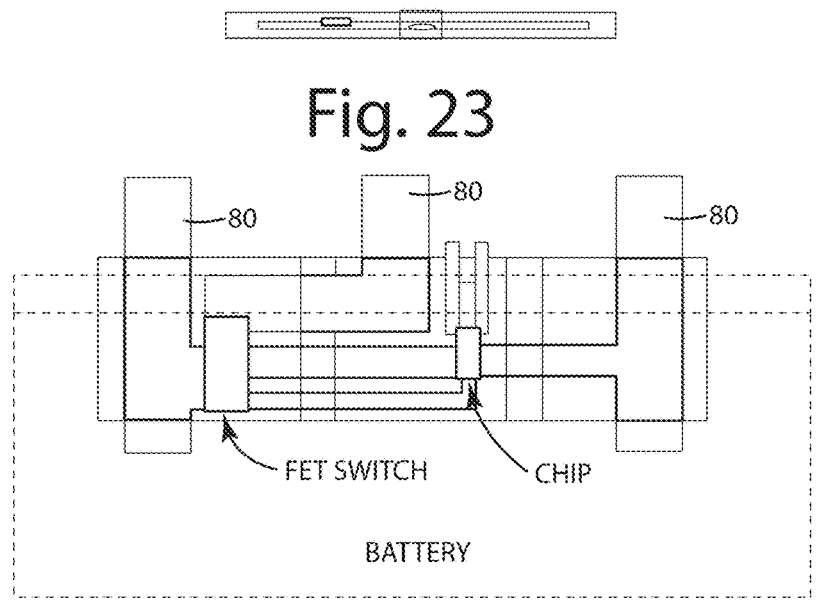
Fig. 24
Fig. 25

BATTERY MONITOR SYSTEM AND METHOD

BACKGROUND OF THE INVENTION

Some embodiments of the present invention relate battery monitoring and some aspects relate to recycling of batteries. Today with the increased expectations of battery systems and increased usage, additional life cycle and event information is needed. We see an increase in the explosion or energy-releasing events causing great concern yet products using these batteries are ever increasing in demand. With the addition of electric vehicles, thousands of cells per car battery are used to create the power needed for the full system.

Although some of these systems are already monitored the information is lost past the first application. Batteries are produced as cells and then configured into modules, packs and systems.

In the past world of battery manufacturing monitoring was a simple task of voltage and current; but now chemistries have become more critical and limits have become more important. Production materials are more flexible and allow manufacturing variations.

Some embodiments of the present invention also relate to ways to identify and rank what kind of life cycle and events a battery has had. This may enable additional use or recycling recommendations.

Some known issues with present systems include the limitation of pack versus single-cell monitoring. Series and parallel packs are used to interconnect a large battery system. Some of these systems have 7700 individual battery cells forming one large battery pack. When a battery issue occurs it impacts the complete system; the system is not self-healing. Present monitors only track the performance while the battery is in that system.

Another issue with the present monitoring is that cell level issues and changes are not tracked. An example is monitoring parallel cells for performance, individual difference are viewed as a whole. By tracking these types of changes, more information of usage and performance could be tracked over the life of the battery from manufacturing to initial use, to reuse or refurbishment, to repurposing to recycling. This information could be used to improve the overall design and design requirements.

SUMMARY

The first inventive aspect of this system utilizes a secure NFC type of communications that allows zero draw from the battery for checking information regarding the battery. The NFC and Laser P-Chip solutions both have memory that is dual ported and includes control registers of the memory that can enable and configure a second active monitor to do multiple tasks. It can monitor the battery when thresholds are reached or events are triggered. In an embodiment where both NFC and high frequency RFID are utilized, the dual ported memory is also utilized to prevent conflicts and data collision. The battery monitor reads, coulombs, current, voltage, temp, charge rates, and discharge rates, self-resistance over time, and stores that in the accumulator matrix. The system can also be programmed from the NFC or P-Chip resisters to read at intervals and accumulate that data over time. Both of these systems allow self-powering utilizing power harvesting with the P-chip using the laser power and NFC using the RF power.

Another aspect of this invention is creating a means to detect and see that changes in battery parameters over its life and use. By accumulating the data over time and watching the accumulators, the life story of that use case for that specific battery is told.

Another aspect of this invention is creating a system for ease of recycling. This system creates an easy to read and sort method for recycling. The battery can be assigned end-of-life, which closes a self-discharge resistor that prepares the battery for recycling by draining the energy before shredding the battery. The secure NFC system can be read to determine battery type, chemistry, requirement, recycling method and timing to zero energy.

Another aspect of this invention is the ease of mounting this to a traditional battery cap. The chip easily sits between the present battery cap and the new cap. The switch can turn off the battery by interrupting the flow of current and the NFC coil can be easily incorporated to read the battery from the top. High frequency data can be read from a distance for manufacturing and technical troubleshooting.

Another aspect of this invention is the means to rank battery usage and life by tracking distributions over types, manufacturers and battery history. Some batteries are going to be treated better and will have additional life.

Another aspect of this invention includes a custom IC that includes all the needed circuitry that enables a monitor and battery recycling system. Each can be easily used for the newer battery systems but the data can be retained within the battery for easy recycling.

Another aspect of this invention is a secure network for reading, reprogramming and writing to these battery monitors. Updated patterns and triggers can be pushed for additional sensitivity for either accumulating data or enabling events.

Another aspect of this invention is the use of self-healing switches. If the battery is configured in parallel that battery can open up to prevent discharging it's parallel connected batteries. Likewise in a series configuration when a battery is in danger or has expired it can open internally but short to prevent the circuit from being broken allowing the remaining batteries to continue operation.

Another aspect of this invention includes workflow consolidation for a greater perspective and knowledge base of the life cycle of a battery cell.

Another aspect of this invention is that it can be turned off with a crypto security lock. The example we use is TSA and safety organizations but this will work even in manufacturing and other applications saving battery life and enabling additional information. FIG. 1 illustrates one embodiment of prior art where the system monitors batteries each cell at a time and is an addressable part by Linear Technologies. In the prior art we see either a single cell system that is powered externally and monitored externally or parts that enable systems monitoring. Either way these types of systems are limited in the data they monitor and how they are controlled.

BRIEF DESCRIPTION OF THE DRAWINGS

FIG. 11 shows a battery scoring and ranking system that tracks the distributions of various parameters, events, and historic use to track tips and tails of the overall distribution percentile.

FIG. 12 shows an example of the ID and protocol shared from the battery when requested.

FIG. 13 illustrates one embodiment of a battery care monitoring and tracking system. A battery manufacturer may want to track each interaction and event to score and track these events.

FIGS. 21-23 show various views of a controller chip for a battery monitor manufactured into the packaging of a lithium ion battery.

FIGS. 24 and 25 show the packaging for a lithium ion battery including a pouch heat seal area.

DETAILED DESCRIPTION

Reference will now be made in detail to exemplary embodiments of the present invention, examples of which are illustrated in the accompanying drawings. It is to be understood that other embodiments may be utilized and structural and functional changes may be made without departing from the respective scope of the invention. Moreover, features of the various embodiments may be combined or altered without departing from the scope of the invention. As such, the following description is presented by way of illustration only and should not limit in any way the various alternatives and modifications that may be made to the illustrated embodiments and still be within the spirit and scope of the invention.

Figure 1:
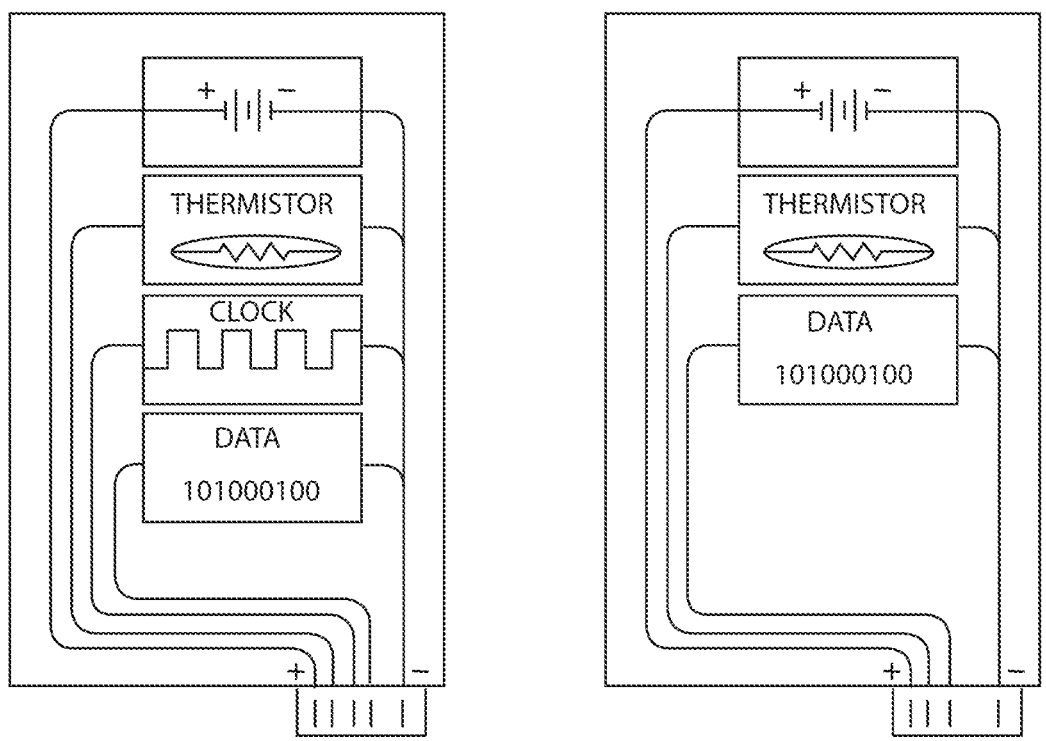
FIG. 1 illustrates a prior art embodiment of a battery monitor from Linear Technology that monitors each cell voltage as prior art for a system level design.
Figure 2:
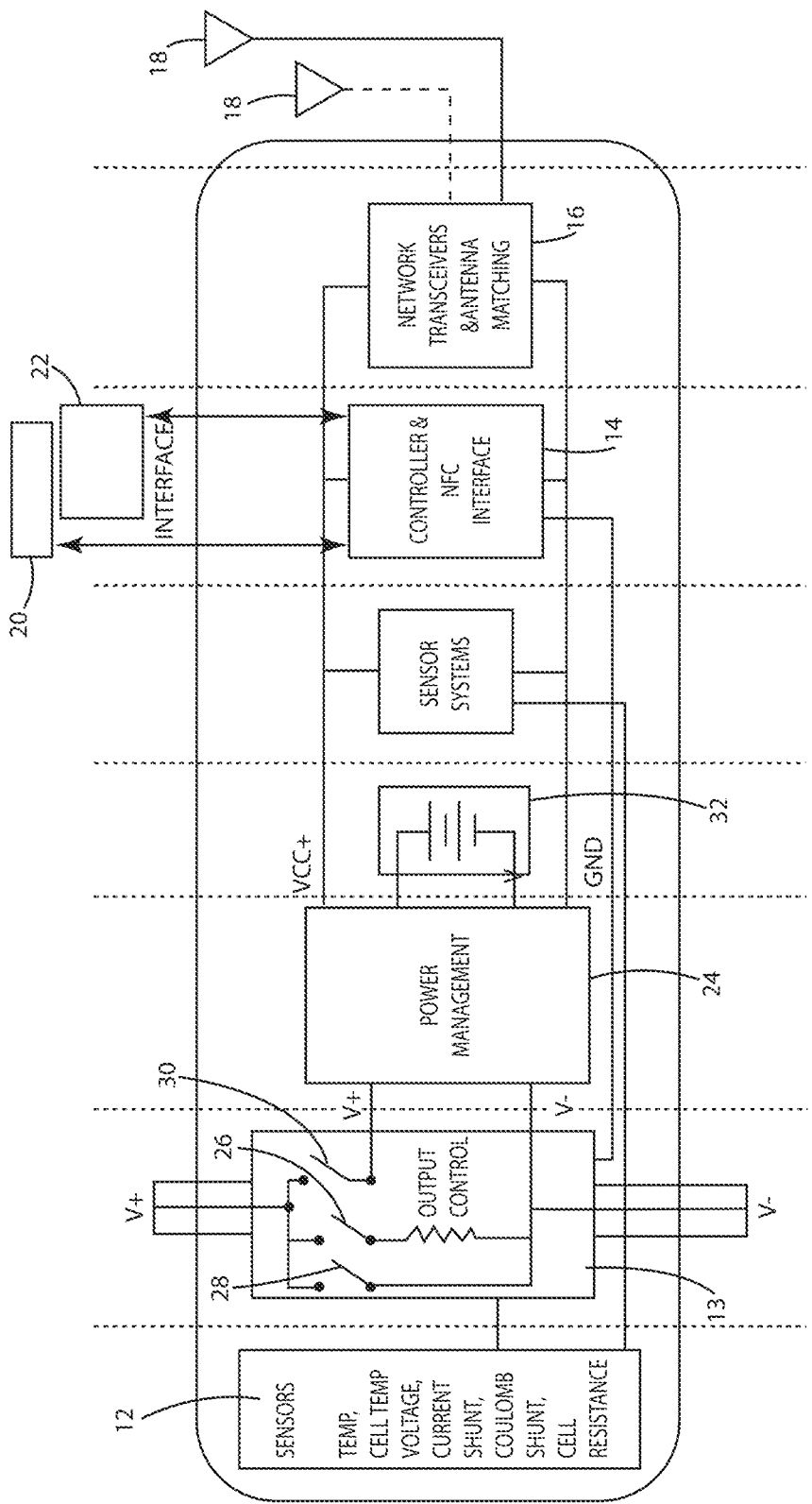
FIG. 2 illustrates an embodiment of a battery monitor and control system that includes multiple sensors and multiple switches for enhanced operation.

FIG. 2 illustrates a system diagram for a battery monitor 10. The system may include numerous components, as described below, contained on the monitor or within the chipset. The monitor 10 may be generally configured to connect to a battery, such as at one or more terminals of a battery, and to monitor conditions of the battery and in some cases provide safeguards against unwanted conditions.

The battery monitor 10 may include one or more sensors 12. The sensors 12 may be configured to each sense at least one parameter of a battery 13 connected to the monitor 10. The sensors 12 may any appropriate type of sensor for sensing a battery condition, such as a temperature sensor, voltage sensor, current sensor, coulomb sensor, or the like.

The sensors 12 may function as inputs to a controller 14. The controller 14 may be any appropriate microcontroller, as described further below. The controller 14 may be configured to monitor the sensors and record data provided by the sensors, and in some circumstances, to provide safeguards to prevent unwanted conditions. The controller 14 may be configured with one or more communication interfaces, facilitated by one or more transceivers 16 and one or more antennae 18. The transceivers 16 may include BTLE and Zigbee Mesh transceivers for special operations and network functions. The antennae 18 may include a mesh antenna, a BLE antenna, and/or any other appropriate antenna. The communication interfaces may be provided on board on the controller chip 14 or may be provided on a separate chip 16. For example, the controller 14 may include a wireless communication interface that may further be configured to provide independent power to the controller. The wireless communication interface may be a type of radio frequency identification ("RFID") communication interface, such as near field communication ("NFC") interface or the like. The NFC interface may include an NFC coil 20 to receive an RF signal and may be configured to independently power the controller when an RF signal is received by the coil 20. The controller 14 may further include a wired connection 22 such as a single wire communication connection.

In an embodiment, the monitor includes a temperature sensor 12 to enable temperature readings of a battery while the battery is discharging and charging. The controller 14 may be enabled with a first level of security that monitors temperatures to determine a potentially unsafe or unwanted condition, such as when the temperature reaches a predetermined threshold. The controller 14 may then act by actuating an output, such as described below, to prevent the unwanted condition.

The sensors 12 may include circuitry to gather a high precision voltage measurement. This sensor circuitry utilizes built in voltage references at low and high voltages to enable calibration and reference based measurement, such as at the battery terminals. Readings may be statistically averaged by the controller 14 and referenced to the offsets from the measured references. Highly accurate A/D registers may be used by cascading multiple 12 Bit A/D converters. These are used in conjunction with reference voltage references for additional accuracy by allowing the small changes due to temperature and voltage to be compensated. The high-resolution A/D converters are used to calculate resistance and measure current across the switch which acts as a shunt. Coulombs are calculated over time using the precise voltage across the shunt. The current over time represents the coulombs for both charging and discharge. 1 Coulomb per second is 1 Amp and represents a 1 C charge or discharge. By counting Coulombs the microcontroller 14 can estimate state of charge for the battery. Although battery life is provided as a first application for this technology, this same technology can be used for super capacitors. Watching Coulombs over time builds an image of the battery capacity. Watching this image over time enables us to see changes and set usage thresholds for recycling.

The battery monitor 10 may include a power management 24. The power management 24 may generally provide verified voltage levels for all components of the battery monitor. The power management 24 may enable a buck boost converter for energy harvesting enabling one cell operation down to 0.2 VDC. In an embodiment, an optional battery cell 32 can be dedicated to powering the monitor for special purpose batteries. The cell 32 may provide dedicated power to the monitor 10 to ensure power at all times, not just when an NFC field is present. This may be a monitoring cell for engineering and data collection purposes. The controller 14 may be enabled with FLASH so it can be reprogrammed securely. The NFC protocol and tokens enables the security and other data like serial number can be presented to the second RFID high frequency protocol for reading at greater distances. Given the security of the NFC communications comparted to the high frequency communications, the NFC may be the only communications enabled to write to the controller 14.

In an embodiment, the monitor 10 may be configured to function even when disconnected from the source power. and still controlled and the figure shows the switch to the power management that is de-energized when requested. This monitor is designed to be globally communicating and updatable as we learn more and the various users learn more by analyzing the data.

The monitor 10 may include one or more outputs configured to be controlled by the controller 14. The controller 14 may control a self-discharge resistor switch 26 that may be opened or closed across terminals of a battery or cell to selectively drain the battery or cell when an unwanted condition is detected. The monitor 10 may include a bypass switch 28 to bypass a battery or cell when an unwanted condition is detected, such as when a series of batteries or cells are connected in series to avoid complete loss of power. The monitor may include a power management switch 30 to selectively control power input from the power management 24. Each of these switches may be controlled by the controller and programmed to be activated or deactivated based on various sensed conditions, as further discussed below.

In an embodiment, the controller 14 and/or components of the monitor 10 may be powered by the NFC communication field. When the NFC field is present, the NFC coil may receive power and enable the controller to be programmed to perform specific functions, such as by writing to the NFC memory. When the high frequency chip is read it accesses the same memory with specific programmed access as determined. This may be just SKU or serial number data for that cell. This memory may be dual ported to enable the controller 14 to see these changes and reconfigure it's operation or programming. An example of this would be to write to the NFC in production to monitor the self-discharge.

Figure 27:
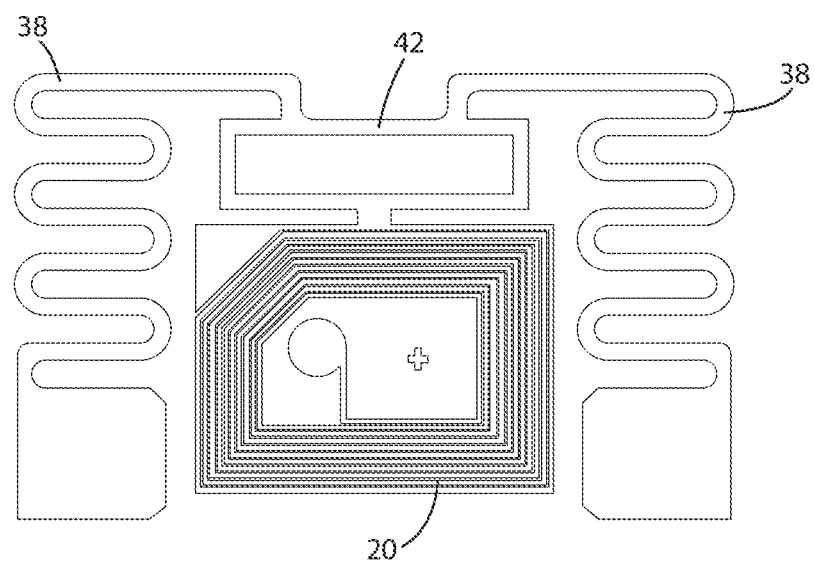
FIG. 27 shows a dual frequency tag configuration where each tag has a different access to the information available as determined by the arbitration logic.

The monitor 10 then consumes and logs the data over time until power is drained. The same type of NFC write can enable the self-discharge resistor 26 for recycling and shredding. It is first activated for discharging the battery and then the NFC is used to read the voltage before shredding to prevent fire as the battery will naturally increase voltage after discharged and potentially become a potential energy hazard. Another command from the microcontroller 14 may close the bypass switch 28 to short the battery externally and open it internally. It should be noted that in these test states the data may be programmed to be presented to the high frequency tag for reading test results from a distance like walking the inventory storage. As used herein, the term tag may refer to both an antenna or coil as well as a chip or semiconductor connected to the coil. As illustrated in FIG. 27, the monitor 10 may include both a high frequency tag 38 and the NFC coil 20 to enable both NFC communications and high frequency communications. FIG. 27 shows the two tag antennas 20 38 connected to one chip 42. The chip 42 is actually two chips combined and allows either tag to be used. The memory arbitration controller allows each communication means to communicate as desired at any step of the use case, namely production, manufacturing, reuse, recycling, testing, and troubleshooting. The access granted to the monitor through high frequency communications may be limited. For example, the high frequency communication may limit access to the controller 14 such that programming the monitor is not an option from the high frequency communication. In another example, the high frequency communication may be limited to accessing data that has been previously gathered. This may allow for fast gathering of data over the high frequency communications, while the NFC communications may allow for no parasitic power draw from the battery 13. The tag reader is connected to the cloud and presents the instant test data to the cloud database.

The controller 14 has a single wire addressable network interface 22. It can be an I2C interface and a command set can report addresses and then data associated with each battery. In an embodiment, the sensors 12 include an accelerometer for monitoring shock and movement events.

Figure 4A:
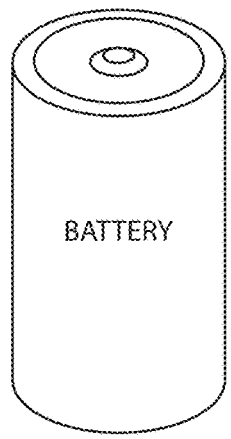
FIGS. 4a and 4b illustrate embodiments of a mechanical connection means of the monitoring and control system to an existing battery assembly with the NFC coil on top or on the side.
Figure 4B:
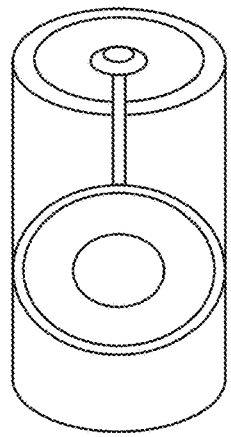

The NFC coil 20 may be mounted on the cap of the battery or on the side (as illustrated in FIGS. 4a and 4b) with a small amount of ferrite or isolated pressed iron under the NFC coil 20 to enable good NFC reads and writes. The ferrite or isolated pressed iron works for the low and high frequency tags for mounting on metal. This is accomplished by isolating the coil 20 from the battery or terminal metal.

Figure 3:
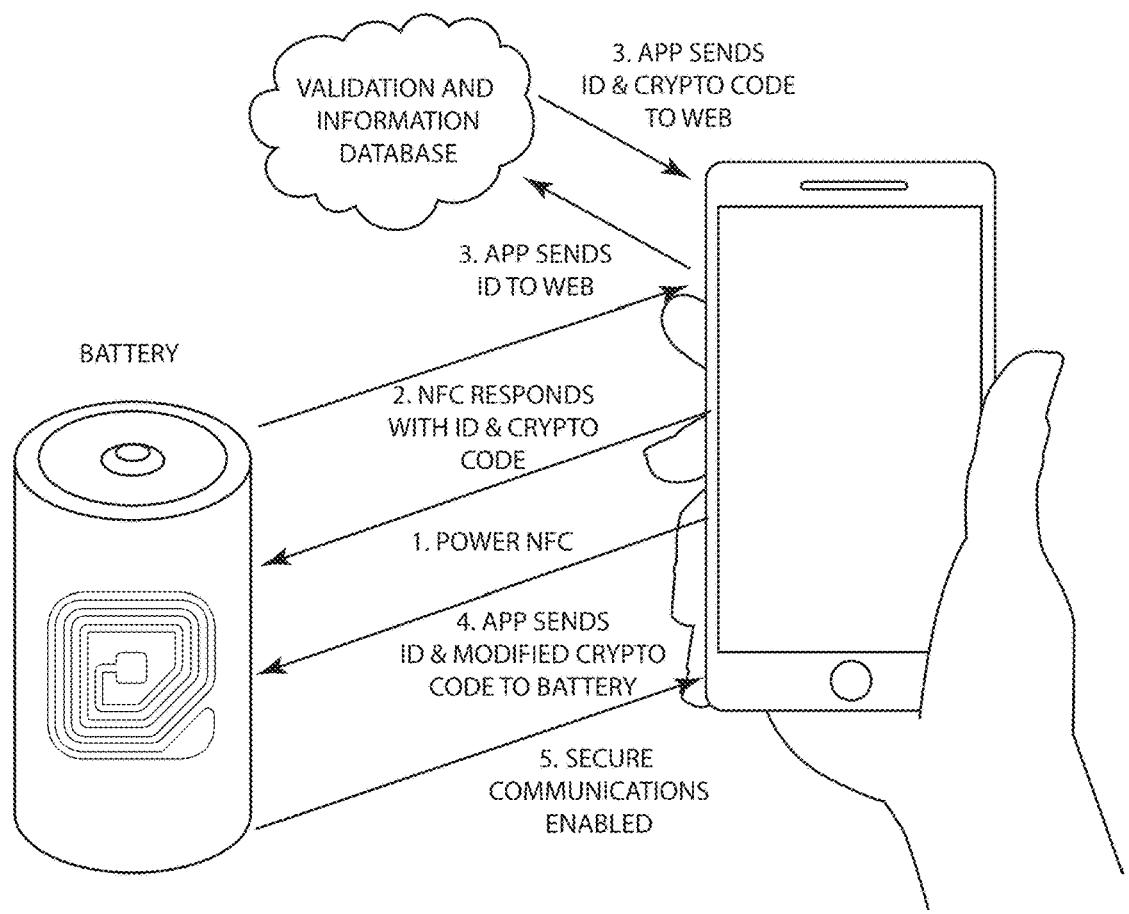
FIG. 3 illustrates one embodiment of a secure NFC and crypto enabled communications, reprogramming and writing of data.

FIG. 3 shows the process of securely reading and validating the monitor 10 using the NFC protocol to open channels to specific data and data segments. For example, a mobile device 36 may NFC capabilities and be enabled to communicate to the battery monitor 10. Specified or limited access to the monitor 10 and its functions may be given to different parties. For example, a manufacturer can have specific access, an OEM can have specific access, a recycler can have specific access and a second user can have specific access. With each read the manufacturer can update the firmware within the battery 13 with new firmware and thresholds of learned understanding from the field as this data is also collected the same way. The crypto code in the monitor 10 and the authentication application enables a secure handshake when reading the logged data. The application utilizes this channel to send the logged data to our database enabling statistics and learning over time and over each user or use through its life. As illustrated in FIG. 3, the process of validation may start when the NFC field is powered up on the mobile device 36. The NFC transceiver 16 on the monitor 10 may respond to the field with an ID and crypto code. Software, such as a mobile application, on the mobile device 36 may then send the ID to a specified address on the internet where validation takes place. The application may then receive an ID and crypto code which it communicates back to the NFC transceiver 16 to code the monitor 10.

FIG. 4a illustrates use of the monitor connected to the battery cap 40. The controller 14 is powered across the battery 13 when enabled or by the NFC field when read. FIG. 4b illustrates a side mount version where the controller 14 is still positioned on the cap 40 but the coil 20 is located on the side of the cell. These coils 20 can be isolated from the metal with either space or ferrite or pressed isolated iron to assure communications. A simple plastic cap provides enough space in the cap to enable good NFC reads. Although this image shows only a low frequency tag both low and high frequency tags for additional flexibility may be used. This is referenced in FIG. 27.

Figure 5:
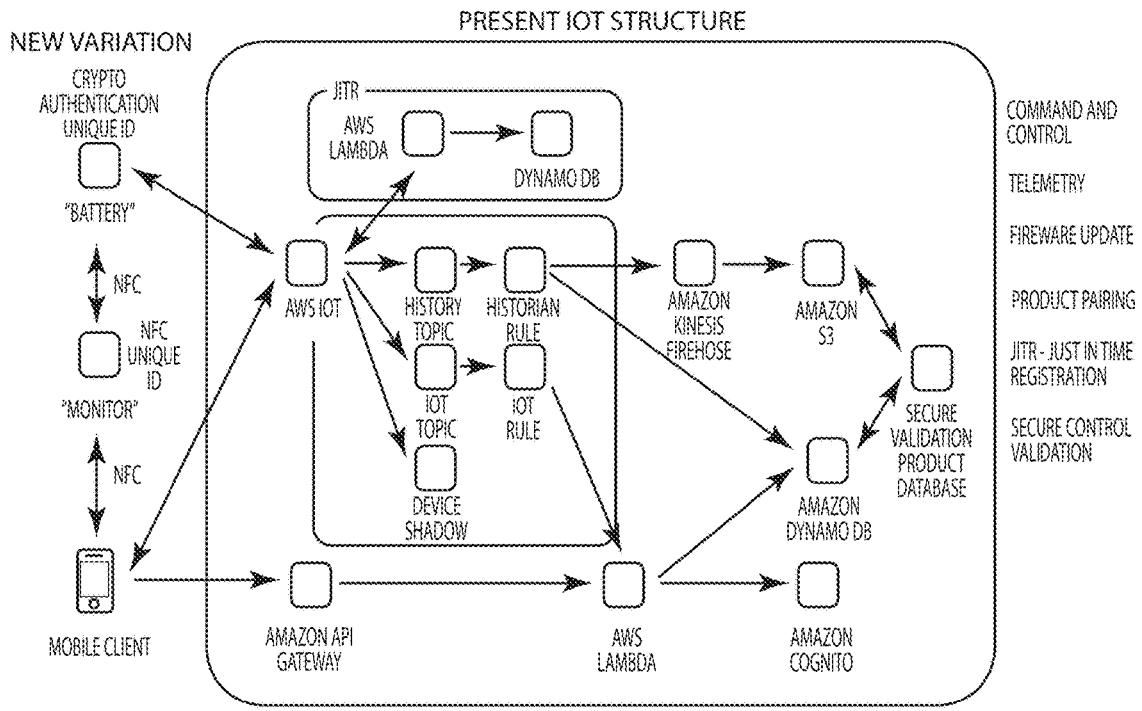
FIG. 5 illustrates an embodiment of the Secure network with just in time registration and crypto security for a battery monitor system.
Figure 6:
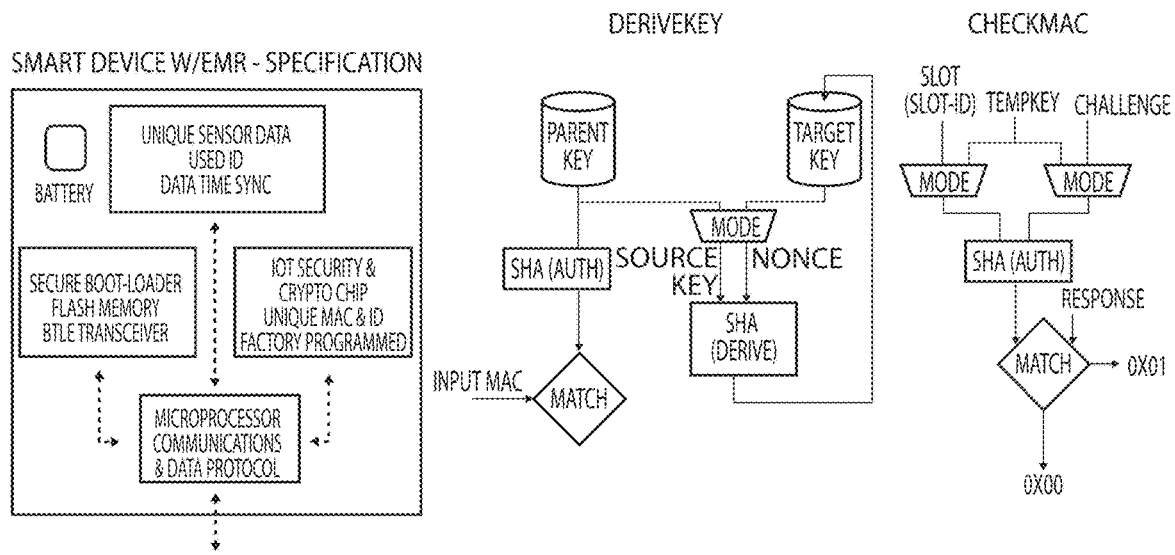
FIG. 6 illustrates the crypto chip used to pass a key to be compared to the built in key preprogrammed and located within the chip.

FIG. 5 illustrates a method of utilizing AWS ("Amazon Web Services") and Just In Time Registration in conjunction with the monitor 10. This method connects devices, applications and helps to manage software by keeping a mobile image and shadow device for validation and secure firmware revision control. This system is scalable and can be deployed globally with ease and simplicity once the serverless framework is set. An Atmel Crypto chip may be utilized for additional crypto security for updating the IOT firmware as seen in FIG. 6. As shown, a key is passed when a target key is presented. If the match is made then a secure pipeline is created. This enables a secure network that can be used to monitor batteries in real time, when read, reused or when re-tasked.

Figure 7:
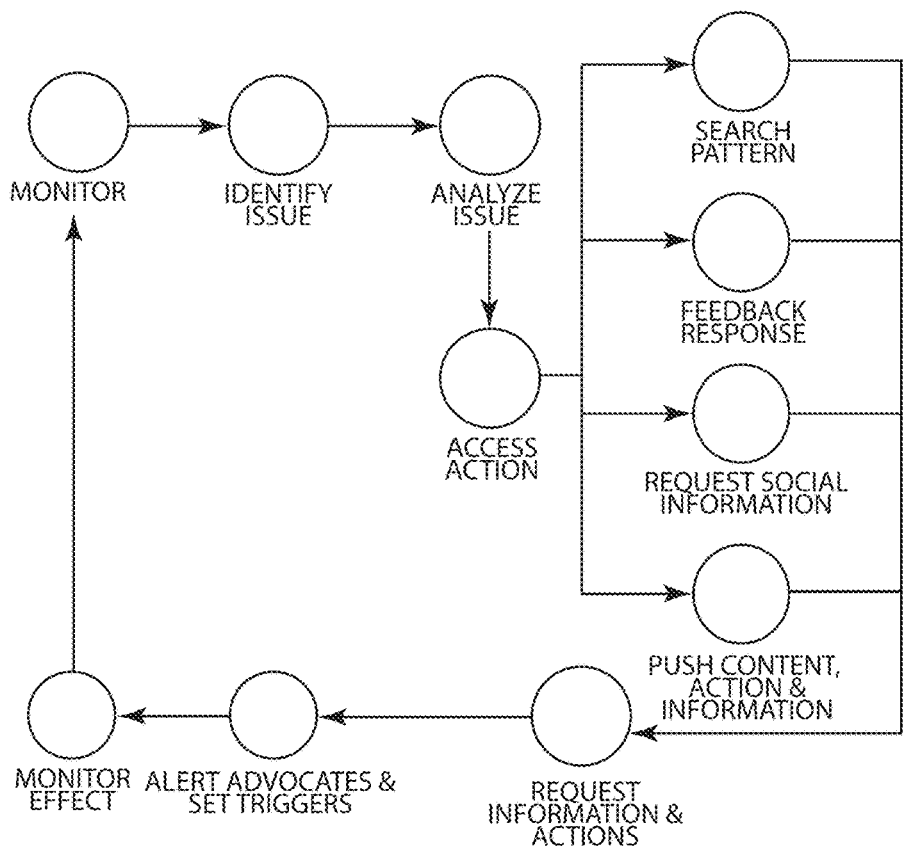
FIG. 7 illustrates an example of a system that looks for patterns and matches patterns with events to track issues and analyze actions.

FIG. 7 illustrates a method of pattern matching and anomaly tracking that may be used to surface issues and enable potential solution to problems. Finding patterns in the data, activities, social groups, disease states, effects and side effects helps to identify the level of importance in a dataset. Data collected by the controller 14 may be monitored to recognize patterns and states. Under various conditions, identified parties may be notified or preprogrammed messages sent via communications to the network. A series of patterns are preloaded and triggers are set that enable communications and logging of data received by the controller 14. The monitor 10 has several programmable power modes to log critical data from full off to store when read by NFC to writ on update time or event and full always on monitoring. The triggers and actions are programmed along with specific effects and monitoring conditions are set.

Figure 8:
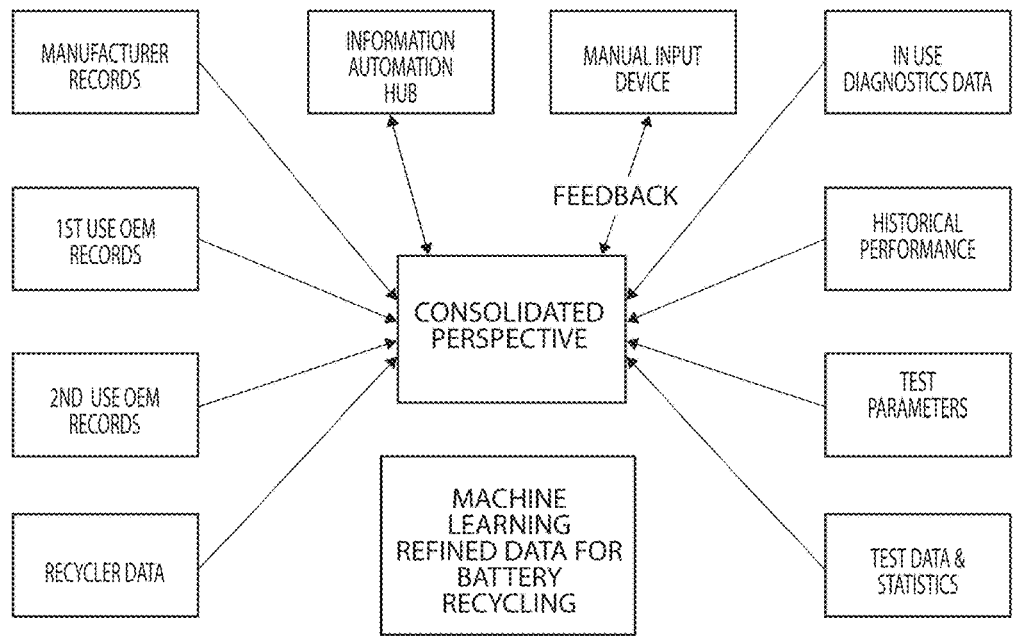
FIG. 8 illustrates the combination of data from multiple workflows to gain a better perspective of use and change over life.

FIG. 8 gives an example of how the workflow is tracked over the various use cases and users. Typically batteries are tracked separately from the primary manufacturer, that battery may get packaged and tested again, then again by OEM on implementation, and yet again when re-tasked and recycled. In an embodiment, a method of storing and sharing this information over the life of a cell is provided. The data may be collected for analytics and machine business learning by the controller and associated memory and used to improve specifications and usage. This data can also be used to prove what chemistries work best and what manufacturing methods prove most reliable. This method can work down to the best manufacturers and batteries for each specific function. This consolidated perspective will provide learning for all is applied. A first secure and local communication (such as NFC) enables the second less secure RFID access to be presented data differently and in different programmable states.

Figures 9, 10:
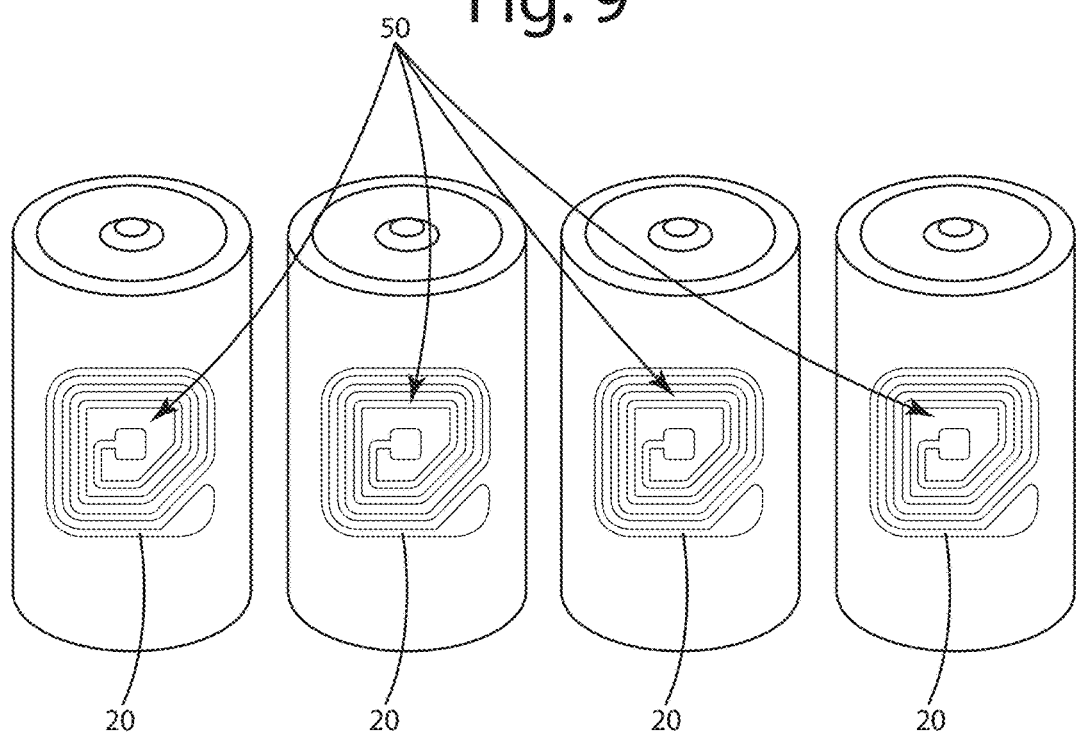
FIG. 9 illustrates the accumulator matrix this data storage method is designed to record data over time and accumulate that data into accumulator bins. This is a representation of the 3D perspective of the life and history of that battery.
FIG. 10 illustrates a parallel battery network where prior systems would have a difficult time reading each respective battery.

In FIG. 9 the accumulator matrix is shown. It represents bins of information that enable a ranking or scoring of the intensity of use for this battery. This matrix is designed to accumulate life critical situations over the life of the battery and life specific events like each workflow transition. The matrix is temperature and charge based with the bins being recorded as events. The distribution of this data represents a signature of the life and treatment of that battery within an environment and application. We need this data beyond one workflow to determine the best application and thresholds for reuse and recycling.

FIG. 10 illustrates a parallel battery pack where each cell can be monitored and tracked within a parallel configuration. The multiple monitors 10 tied to each battery or cell may be then connected over a communication network 50. The network may be a single wire network, NFC or DC backscatter over the DC bus. It should be noted that this can be a single RFID technology or multiple low and high frequency access.

FIG. 11 shows a health scoring formula for enabling the ranking of the batteries life, severity of use and experience. The distributions are evaluated and these show the average with the tips and tails of the distribution curve. This represents the life signature of a battery and shows what impacts the life of each type of battery. In an embodiment a system may include or utilize a database of millions of batteries and types enabling a better understanding of the limits and design methods that makes a better battery. In an alternative embodiment, the data may be used to define thresholds for recycling and fitness of health for reuse. An algorithm accesses and uses the accumulator matrix along with internal resistance, temperature, charge discharge rates, age and activity acceleration to determine and rank a health score. This also becomes a means to define who makes the best batteries and define what chemistries and manufacturing methods are best over time. This information will be used to better these processes and methods.

In FIG. 12 a representation of battery health and care scoring is shown. This score determines how the battery has been maintained, it monitors events and service interactions within the workflow to show who comes into contact with the battery and for what purposes as this may also impact life. A poorly maintained battery may be rerated while a well-maintained battery may have extended life. FIG. 13 shows the byte count and protocol for the registers. It shows primary and secondary registers to enable a transfer methodology for secure data transfer over the life of the battery monitor. This method keeps the secondary registers intact until the primary registers are updated and verified by checksum. Upon validation the secondary registers are also updated. This process keeps the data integrity in the event of a power fail, read or write error, glitches in power or accidents.

Figure 14:
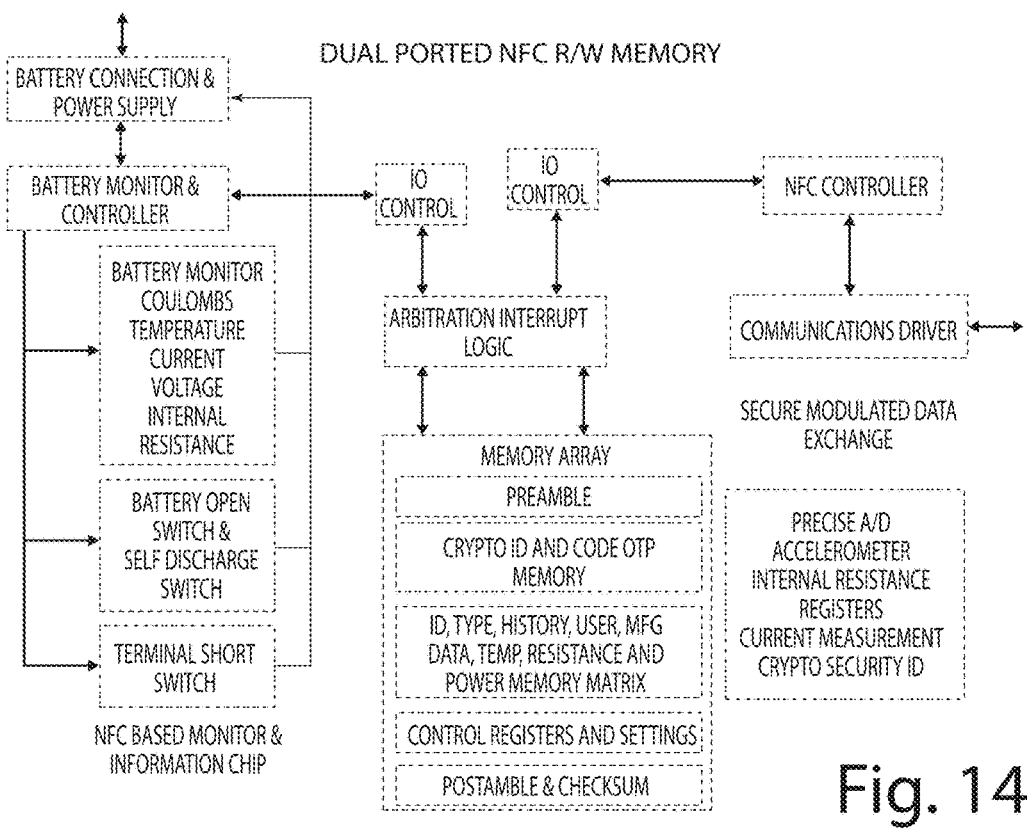
FIG. 14 illustrates ASIC chip design with a dual port memory for reading and configuring a second system to monitor the data and a first system to enable secure data communications and zero power interface.
Figure 15:
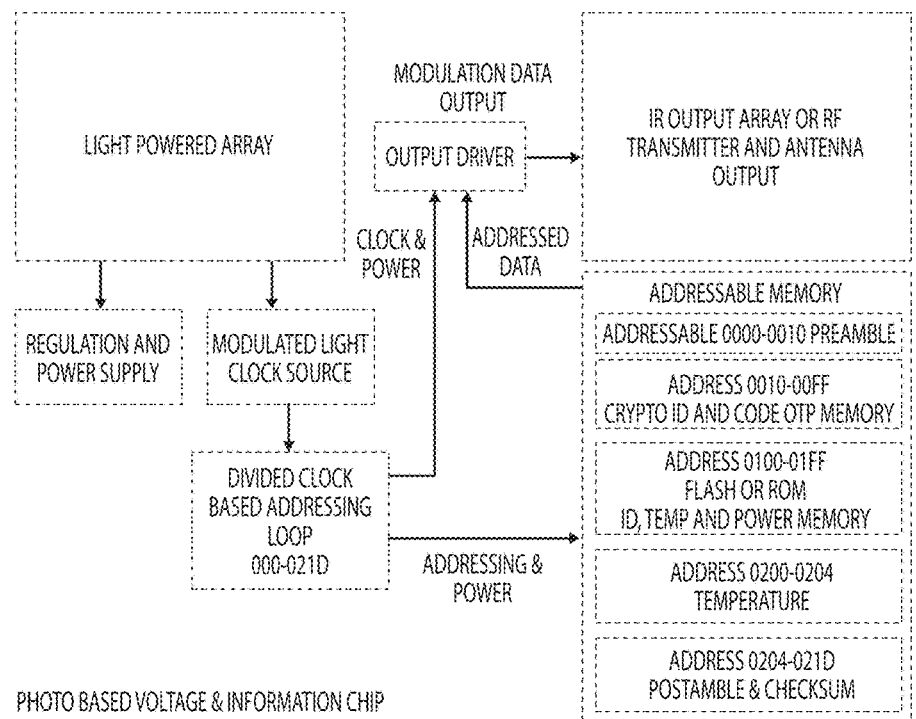
FIG. 15 shows a chip layout for a photo powered identification chip. This chip uses a modulated Laser LED for power and can communicate with IR or RF.
Figure 16:
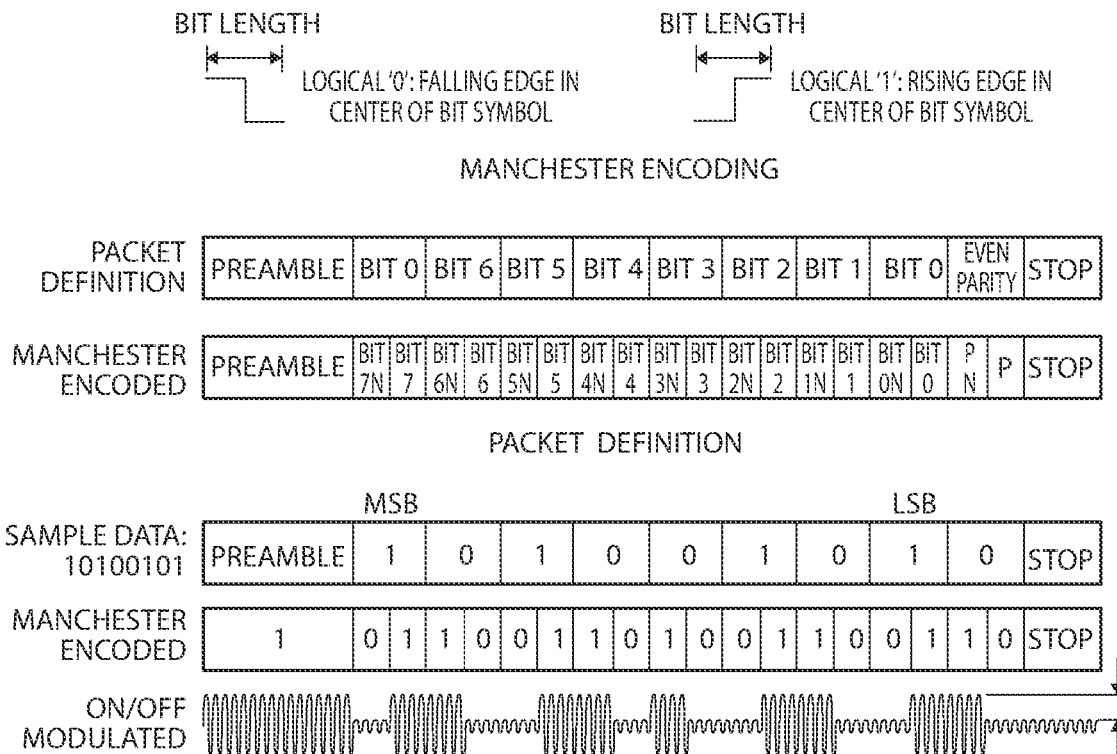
FIG. 16 illustrates one embodiment of the communications format and modulation the for NFC and P-Chip protocol.

FIG. 14 illustrates the ASIC layout for a single chip design for the controller 14. The single chip design includes a plurality of the features illustrated and described from FIG. 2 on a single chip. The NFC controller is included on board the single chip and is the basis of the design in conjunction with the controller 14. The NFC may utilize a dual ported memory for the NFC enabling control and typical NFC reading and writing. This chip incorporates all of the sensors and registers mentioned in this document for tracking workflow and life data over these uses. The arbitration interrupt logic allows memory access to multiple systems. This arbitration logic is programmable by direct I2C programming or by NFC local communications. The programming allows the system to determine what is available to different ports for example if we add another tag technology access for longer distance. The high frequency tags would be a good example of adding another access. Two I/O controls by additional I/O controllers can be added for additional flexibility. FIG. 15 shows the communication protocol for backscatter communications in addition to the typical NFC protocol.

Figure 17:
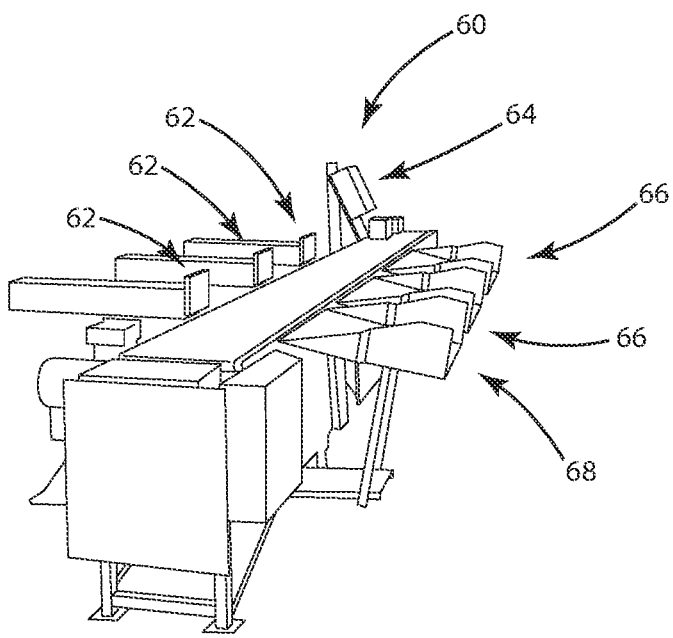
FIG. 17 illustrates a battery sorting system that enables bin sorting by enabling a plunger to push the battery off the conveyor into the bin after reading the NFC battery data.
Figure 18A:
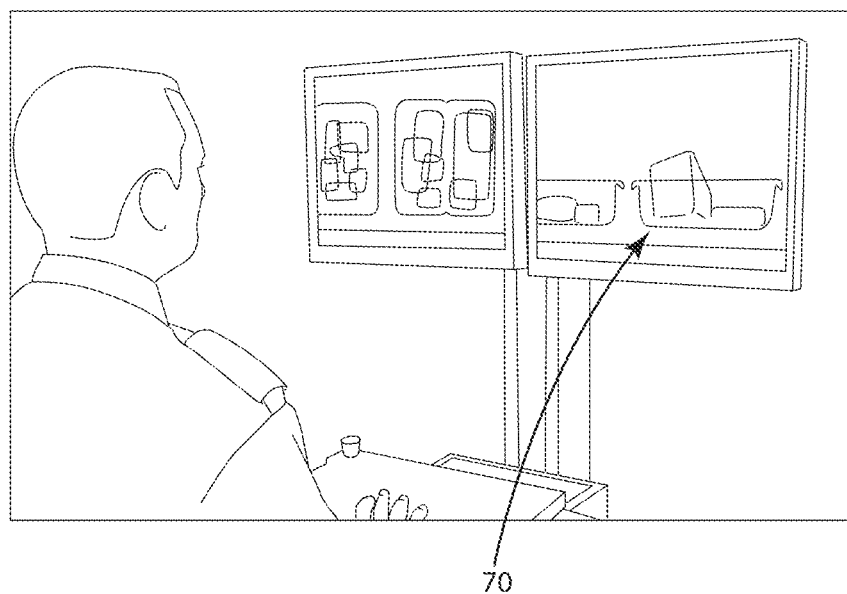
FIGS. 18a and 18b show one embodiment of a secure area that can read battery validity and turn these batteries off and on as needed.
Figure 18B:
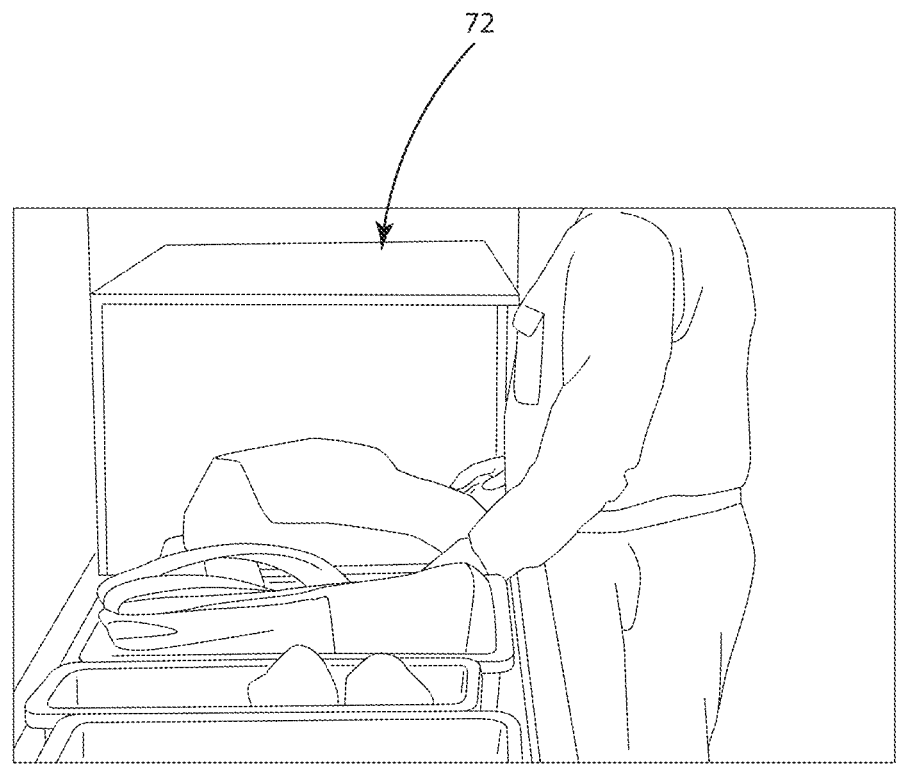
Figures 19, 20:
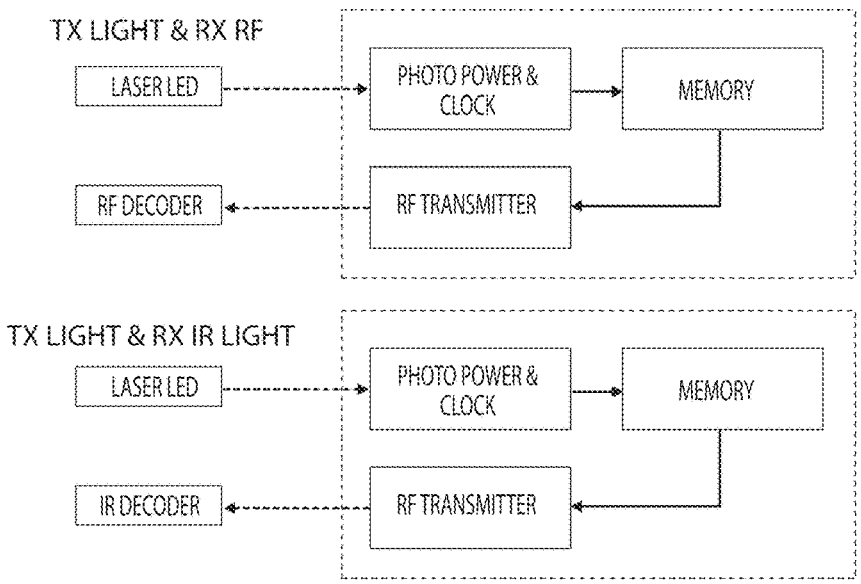
FIG. 19 shows the P-Chip used as a IR transmitter and a RF transmitter.
FIG. 20 shows the battery commands and control structure to enable various programmable modes.

FIG. 17 shows a system 60 and method for sorting and reading batteries in production. This system 60 uses a larger antenna 62 for NFC reading of each battery as it is conveyed a long a conveyor 64. The antenna reads each battery for type, life and charge state gathering all the data before reuse or recycling as it sorts the batteries, such as into a charge bin 66 or waste bin 68. In the event a battery is scheduled for recycling the sorting machine opens the output and selects the internal discharge process to remove energy before shredding. This process can typically cause issues as batteries can be discharged but they build voltage after that process over time. The internal discharge circuit enables a simple recycling process. Type sorting by battery chemistry, size, manufacturer or other criteria becomes very simple. In FIGS. 18a and 18b show a method of checking batteries for security purposes and even testing these batteries for verification that they are manufactured as intended. FIG. 18a illustrates a security monitor 70 that may provide the status of a battery by reading the status through an NFC antenna positioned within the screening zone. FIG. 18b illustrates a conveyor having an NFC antenna positioned in a screening zone 72 that may both read a battery status and send a command to the battery, such as to turn the battery off. These batteries can be disabled if they are not intended for transportation by enabling the internal switches with a crypto password, as described above. They can again be enabled post transfer or security process along with tamper monitoring and validation.

FIGS. 21-25 generally illustrate a battery monitor 10 manufactured into the casing of a lithium ion battery. FIGS. 21 and 22 show a conductive tab 80 that is surrounded by a thermoplastic layer 82 on both sides. This thermoplastic layer 82 is sealed to prevent the battery electrolyte from passing along the metal tab. The thermoplastic seal is designed to also seal again when the patter is sealed to hold the electrolyte. In order to seal the chip 84 into the battery we need to connect to these tabs. The tab design and stamping is designed to allow bonding of the chip 84 to the tab 80. The way the tab 80 is constructed to allow chip assembly is the first thermoplastic layer is bonded to the tab 80 which holds the tab 80 in place. The tab 80 may be mechanically bonded to a circuit board if needed. The thermoplastic 82 may serve as the circuit board for simple designs.

The tab 80 is also designed to allow welded interconnections or snap like details to interconnect these circuits from each electrode tab. This enables FET switches 86 to be sealed in the same way enable additional sensors or other devices to sense the battery conditions. The additional smaller tabs brought out of the battery are for antenna and coil connections. The FIGS. illustrate two connections but four or more connections may be used for multiple inputs.

Although the FIGS. illustrate the stamping directly on the thermoplastic, a thin PCBA like Kapton may alternatively be used.

When two or three tabs are used, the system may utilize an overlapping connector system to use the thermoplastic top layer and bond to hold the two table together, sealing the full circuit from the electrolyte and applying pressure to enable the interconnection showed as a snap interconnection.

Figure 26:
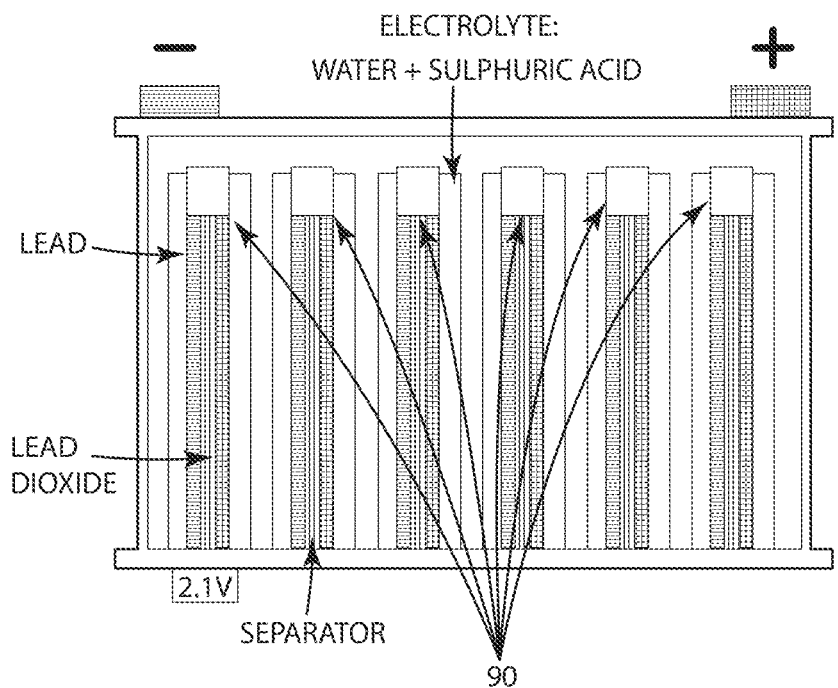
FIG. 26 shows sealed battery monitors within a lead acid battery.

The 12 VDC battery diagram of FIG. 26 shows sealed RFID sensors/monitors 90 positioned at each cell. A plastic enclosure protects the electronics and energy harvesting circuit while electrodes connect to each cell. The design allows the sensors and RFID to be located within the electrolyte and the interconnections to the cell enable monitoring while being of similar materials used within the battery. The battery can be a 12, 24, 48 or larger battery. The cell number is not critical but the interconnections for monitoring is critical.

In one aspect of the system and method described herein, the battery monitor and related methods may be used for battery recycling purposes. Recycling becomes easier because the disclosed monitor and methods enable sorting capability. The sorting machine (FIG. 17), shows an economical and fast way of determining cell chemistries as well as cell conditions.

In another aspect of this disclosure the monitor 10 and methods described herein may be used in second-life applications. A similar sorting process as the one noted above can provide sorting by chemistry and there can be the addition of grading of cells. It will become easier to group batteries by key characteristics to ensure that they behave in a complimentary manner (for example, they will have similar capacity and life-expectancy characteristics) for remanufacturing and repurposing.

In another aspect of this disclosure, a monitor 10 may be installed on a battery during initial creation of batteries at the manufacturer. This is critical because the invention should be applied to the battery during initial manufacture to make it available for remanufacture, repurpose and recycling and any other future applications. The benefit for the new battery industry is that currently cells are built and then immediately charged and discharged to determine correct capacity. This invention will allow improved efficiency by monitoring overvoltage, direct-current resistance (DCR) and heat/thermal. An important benefit of the invention appears when the cells are stored for 3 weeks after production to check for HSD (high self-discharge). Today, manufacturers use robotic equipment to periodically check battery voltages during this 3-week period to ensure there is no occurrence of HSD. With this monitor, the whole process can be modified. For pennies a cell, rather than costly robotic equipment and labor costs involved, this can all be monitored with far greater speed and efficiency. We can provide the ability to display "ALL" the cells under test at one time and/or display only the cells that are outside of the set programmable parameters. The cost savings in this step alone can easily justify the extra costs for the integration of our technology into their cells. The grading/ranking and life-determination over a distribution of like batteries, over the usage becomes very valuable.

In another aspect of this disclosure, the monitor 10 and methods described herein may be used in high-reliability-requirement applications and tracking. An example of this can be seen in military use, like when a field soldier selects a pack for use in an operation. This invention provides a monitoring system that will display whether a battery pack is fully charged and even the capacity in hours at the specific amp draw as needed (in effect determining how long the batteries will last under preset conditions). They can see the life experience of that battery and it's degradation level. The life-ranking information for these batteries is available which will simplify inventory control. The data will be available to determine if a pack can be used as is (all cells working according to specification), repair a pack (some cells may need to be replaced to meet specifications) or discard a pack (if the pack does not meet specs and will not be able to be brought up to appropriate working condition).

In another aspect of this disclosure a monitor 10 may be powered via near field communication (NFC) by configuring registers it performs monitoring functions. This can be powered by battery or NFC. This system has a dual-ported memory so that both functions are fully capable and can operate independently.

In another aspect of this disclosure, an application-specific integrated circuit (ASIC) chip that enables a low-cost battery monitor for reading numerous characteristics and aspects of battery life is used. This can be utilized in any battery for warranty determination, life, date of installation, manufacture, place of purchase, reordering, quick voltage checks, and other aspects. This can be used on rechargeable chemistries, lead-acid (with re-watering and care), and alkaline and/or primary batteries. With this information, a safety mechanism may be used to short-circuit cell that is in a series configuration or open a cell that is in a parallel configuration. This may allow for a battery or module to continue to function while disabling any cells that may be outside of defined parameters. In a single battery cell, this information may allow the cell to be disabled to protect the product it is powering.

In another aspect of this disclosure, a communications method is provided that enables a test process that can be turned on and off at different moments within the workflow and life of a battery. This will enable data collection on a cell by cell basis through the recycling process and allow for a currently non-existent R&D feedback opportunity.

In another aspect of this disclosure, the monitor 10 and methods described herein are applied to existing products in the marketplace. This may apply to individual cells when accessible or to groups/modules/packs of cells when individual cell access may not be attainable.

In another aspect of this disclosure, the application of the invention to various electronic devices and/or components is provided. This may be used to measure the amount of current drawn and voltage applied to various electronic components within a device. The data can be used to determine root-cause analysis failures within a device.

In another aspect, the ICC may be used as a balancer for a battery system by using the monitor 10 and set point capabilities along with the discharge resistor acting as a balance bleed resistor, this unit acts as a wireless balancing network. Enabling battery safety, if one of the balancers would fail, can we use the software in the monitor to calculate the difference voltage of the known reporting balancers in the group against the unit no longer reporting, thereby calculating the known total voltage sum and the missing difference to see if we are still operating at a safe level assuring the best resistance or even switching that resistance over time.

In another aspect of this disclosure, the monitor 10 and related methods disclosed herein may be applied to shipping and transport safety of batteries. By monitoring the cells during transport, information can be sent to a central battery management system (BMS) to give information to drivers, checkpoints/scale operators, TSA agents, Public Service Commission Officers or any other responsible party. This can report unsafe conditions that may be occurring and/or if the batteries are within safe shipping parameters. The cell battery management system CBMS in conjunction with a BCM it will improve the performance and quality of the information provided.

In another aspect having multiple interfaces that represent various capabilities to form a larger capability. Low frequency communications are inexpensive and can be implemented in systems for monitoring directly. The high frequency tags are less expensive but the transmitters are more expensive more suited for production and manufacturing solutions. The combination of these systems along with the dual ported and programmable memory creates a solution fit for technicians, in circuit monitoring, production testing, recycling sorting and overall flexibility.

Directional terms, such as "vertical," "horizontal," "top," "bottom," "upper," "lower," "inner," "inwardly," "outer" and "outwardly," are used to assist in describing the invention based on the orientation of the embodiments shown in the illustrations. The use of directional terms should not be interpreted to limit the invention to any specific orientation(s).

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular.

The embodiments of the invention in which an exclusive property or privilege is claimed are defined as follows:

1. A battery cell monitoring system for a battery having a plurality of electrically interconnected battery cells, the battery cell monitoring system comprising:
   at least one battery cell monitor chipset configured to electrically connect to a respective battery cell of the plurality of battery cells, each battery cell monitor chipset including:
      one or more sensors each configured to sense at least one parameter of the respective battery cell;
      a memory configured to store a battery cell ID associated with the battery cell and configured to receive and store battery cell data based on the sensed parameters of the respective battery cell; and
      a communication interface configured to:
         transmit the battery cell ID over a wireless network,
         receive first authentication information over the wireless network, the first authentication information being associated with a first access level of a plurality of access levels,
         receive second authentication information over the wireless network, the second authentication information being associated with a second access level of the plurality of access levels,
receive third authentication information over the wireless network, the third authentication information being associated with a third access level of the plurality of access levels; and
transmit a first set of battery cell data in response to receipt of the first authentication information; and
transmit a second set of battery cell data in response to receipt of the second authentication information;
transmit a third set of battery cell data in response to receipt of the third authentication information;
wherein the first set of battery cell data and the second set of battery cell data are different.

2. The battery cell monitoring system of claim 1, wherein the second set of battery cell information includes the information in the first set of battery cell information.

3. The battery cell monitoring system of claim 1, wherein the first authentication information includes a first password and the second authentication information includes a second password.

4. The battery cell monitoring system of claim 1, wherein the battery cell monitor chipset modifies battery cell functionality in response to receipt of authentication information associated with one of the plurality of access levels.

5. The battery cell monitoring system of claim 4, wherein the at least one battery cell monitor chipset disables the battery cell in response to instructions associated with at least one of the plurality of access levels.

6. The battery cell monitoring system of claim 1, wherein the at least one battery cell monitor chipset is configured to collect and store the battery cell data over a battery cell lifecycle of the respective battery cell.

7. The battery cell monitoring system of claim 6, wherein the first access level corresponds to a first time period associated with the battery cell lifecycle, and wherein the second access level corresponds to a second time period associated with the battery cell lifecycle.

8. The battery cell monitoring system of claim 1, wherein the first access level corresponds to an original equipment manufacturer (OEM) and the second access level corresponds to a recycler.

9. The battery cell monitoring system of claim 1, wherein the first access level provides access to security information associated with the respective battery cell.

10. The battery cell monitoring system of claim 1, wherein the first access level provides access to battery cell manufacturing information associated with the respective battery cell.

11. The battery cell monitoring system of claim 1, wherein the first access level provides access to transportation information associated with the respective battery cell.

12. A battery cell monitoring system for a battery having a plurality of electrically interconnected battery cells, the battery cell monitoring system comprising:
at least one battery cell monitor chipset configured to electrically connect to a respective battery cell of the plurality of battery cells, each battery cell monitor chipset including:
one or more sensors each configured to sense at least one parameter of the respective battery cell;
a memory configured to store a battery cell ID, a cryptographic code associated with the battery cell, and an access registry, and to receive and store battery cell data based on the sensed parameters of the respective battery cell, wherein the access registry includes a plurality of access levels, wherein the plurality of access levels includes a first access level, second access level, and a third access level; and
a communication interface configured to:
transmit the battery cell ID and cryptographic code over a wireless network,
receive a modified cryptographic code associated with one of the plurality of access levels over the wireless network, and
transmit specific battery cell data over the wireless network depending on the access level associated with the modified cryptographic code, wherein a first set of battery cell data is transmit in response to receipt of a modified cryptographic code associated with the first access level, wherein a second set of battery cell data is transmit in response to receipt of a modified cryptographic code associated with the second access level, wherein a third set of battery cell data is transmit in response to receipt of a modified cryptographic code associated with the third access level.

13. The battery cell monitoring system of claim 12, wherein the first access level corresponds to a manufacturer user, the second access level corresponds to an original equipment manufacturer (OEM) user, and the third access level corresponds to a recycler user.

14. The battery cell monitoring system of claim 12, wherein the first access level corresponds to a first time period associated with a battery cell lifecycle, the second access level corresponds to a second time period associated with the battery cell lifecycle, and the third access level corresponds to a third time period associated with the battery cell lifecycle.

15. The battery cell monitoring system of claim 12, wherein the battery cell monitor chipset is configured to provide:
specific access to a first set of the battery cell data in response to receipt of the modified cryptographic code associated with the first access level; and
specific access to a second set of the battery cell data in response to receipt of the modified cryptographic code associated with the second access level.

16. The battery cell monitoring system of claim 12, wherein the battery cell monitor chipset is configured to provide access to security information associated with the respective battery cell in response to receipt of the modified cryptographic code associated with the first access level.

17. The battery cell monitoring system of claim 12, wherein the battery cell monitor chipset is configured to provide access to battery cell manufacturing information associated with the respective battery cell in response to receipt of the modified cryptographic code associated with the first access level.

18. The battery cell monitoring system of claim 12, wherein the battery cell monitor chipset is configured to provide access to battery cell transportation information associated with the respective battery cell in response to receipt of the modified cryptographic code associated with the first access level.

19. The battery cell monitoring system of claim 12, wherein the battery cell monitor chipset is configured to modify battery cell functionality in response to instructions associated with the modified cryptographic code.

* * * * *